United States Patent
Tanaka

[11] Patent Number: 5,889,326
[45] Date of Patent: Mar. 30, 1999

[54] STRUCTURE FOR BONDING SEMICONDUCTOR DEVICE TO SUBSTRATE

[75] Inventor: Kei Tanaka, Tokyo, Japan

[73] Assignee: NEC Corporation, Tokyo, Japan

[21] Appl. No.: 804,977

[22] Filed: Feb. 27, 1997

[30] Foreign Application Priority Data

Feb. 27, 1996 [JP] Japan ................................. 8-039808

[51] Int. Cl.$^6$ ........................... H01L 23/48; H01L 23/52; H01L 29/40

[52] U.S. Cl. ......................... 257/737; 257/738; 257/778; 257/780

[58] Field of Search ................ 257/737, 8, 779, 257/780

[56] References Cited

U.S. PATENT DOCUMENTS

| | | | |
|---|---|---|---|
| 4,724,472 | 2/1988 | Sugimoto et al. | 257/779 |
| 4,970,570 | 11/1990 | Agarwala et al. | 257/779 |
| 5,028,987 | 7/1991 | Neugebauer et al. | 257/779 |
| 5,422,516 | 6/1995 | Hosokawa et al. | 257/775 |
| 5,508,561 | 4/1996 | Tago et al. | 257/737 |
| 5,611,481 | 3/1997 | Akamatsu et al. | 228/180.22 |
| 5,640,051 | 6/1997 | Tomura et al. | 257/778 |
| 5,640,052 | 6/1997 | Tsukamoto | 257/781 |
| 5,641,113 | 6/1997 | Somaki et al. | 228/180.22 |

FOREIGN PATENT DOCUMENTS 62-281435 12/1987 Japan .

OTHER PUBLICATIONS

Y. Tsukada et al., "The Design of Flipchip Joint by Other Metal Bump –Flip Chip Aattach Technology", *IMC 1994 Proceeding*, Omiya, Apr. 20–Apr. 22, 1994, pp. 419–424.

Y. Tsukada et cl., "The Design and Reliability of Flipchip Attach Joint on Surface Laminar Circuit", *ISHM'93 Proceedings*, pp. 349–354.

*Primary Examiner*—Teresa M. Arroyo
*Attorney, Agent, or Firm*—Young & Thompson

[57] ABSTRACT

Au bump is provided on an Al pad of a semiconductor chip. Substrate pads are arranged at predetermined pitches on a circuit board. In each substrate pad, the length (L) of a first side parallel to the array direction is shorter than the length (M) of a second side which is orthogonal to the first side. The substrate pads are formed so that the length (L) of the first side is smaller than the diameter of the Au bump and the length (M) of the second side is larger than the diameter of the Au bump. A solder bump is formed on each substrate pad and it melts to cover the Au bump. At the time of bonding, the width of the solder bump in the direction parallel to the first side is smaller than the diameter of the Au bump, and the width thereof in the direction parallel to the second side is greater than the diameter of the Au bump.

19 Claims, 7 Drawing Sheets

STRUCTURE FOR BONDING SEMICONDUCTOR DEVICE TO SUBSTRATE

BACKGROUND OF THE INVENTION

1. Field of the Invention

The present invention relates to a structure for bonding a semiconductor device to a substrate and, more particularly, to a structure in which a semiconductor device is bonded to a substrate by bonding a bump provided on an electrode of the semiconductor device to a bump provided on an electrode of the substrate.

2. Description of Related Art

Figure 1A:
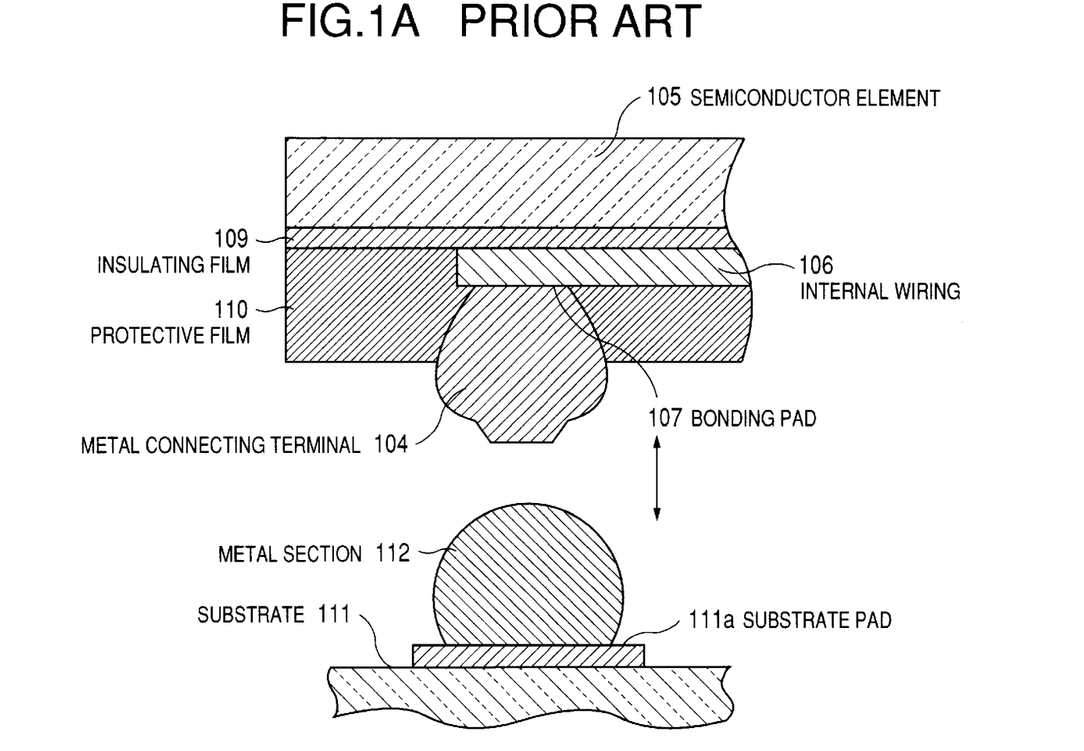
FIG. 1A is a cross-sectional view illustrating the conventional structure for bonding a semiconductor device to a substrate.
Figure 1B:
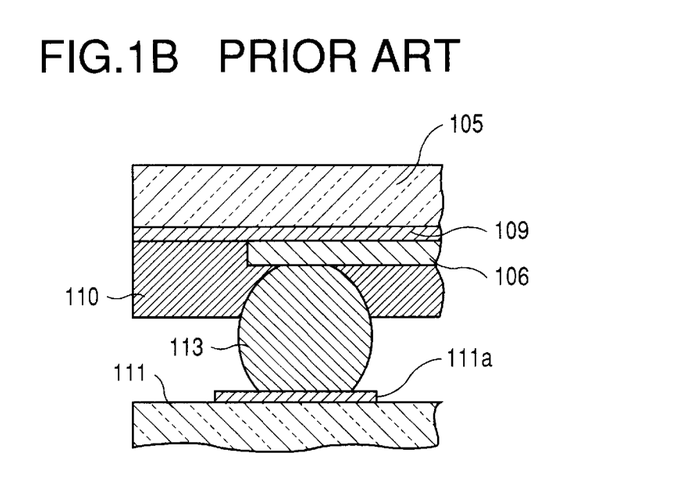
FIG. 1B is a cross-sectional view illustrating the conventional structure wherein the semiconductor device has been bonded to the substrate.

Referring to FIG. 1A, a metal connecting terminal 104 formed by an Au ball is provided on a bonding pad 107 of a semiconductor element 105. Provided on a substrate pad 111a of a substrate 111 is a metal section 112 formed by solder. When bonding the metal connecting terminal 104 and the metal section 112 face down, Au which forms the metal connecting terminal 104 is diffused in the metal section 112 to produce an Au-Sn eutectic alloy. The pattern of the substrate pad 111a is generally circular or square. A joint 113 between the metal connecting terminal 104 and the metal section 112 bulges in the middle thereof like a barrel as shown in FIG. 1B in the process of the melting and solidifying of solder. The section of the joint 113 obtained by cutting it horizontally is circular. Such a conventional structure wherein a semiconductor device is bonded to a substrate has been disclosed, for example, in Japanese Unexamined Patent Publication No. 62-281435, "THE DESIGN OF FLIPCHIP JOINT BY OTHER METAL BUMP—FLIP CHIP ATTACH TECHNOLOGY" (IMC 1994 Proceeding, Omiya, Apr. 20 to Apr. 22, 1994), and "THE DESIGN AND RELIABILITY OF FLIP CHIP ATTACH JOINT ON SURFACE LAMINAR CIRCUIT" (ISHM '93 Proceedings).

In the conventional connecting structure, since the joint between the semiconductor element and the substrate is shaped like a barrel, the stress due to the mismatch in coefficient of thermal expansion between the semiconductor element 105 and the substrate 111 is concentrated on the joint between the bonding pad 107 and the metal connecting terminal 104 or on the joint between the substrate pad 111a and the metal section 112, leading to a shortcoming that breakage is apt to happen at these joints. In particular, the joint between the substrate pad with low rigidity and the metal section is vulnerable.

Further, molten solder flows out of the substrate pad; therefore, when the interval between adjacent substrate pads which are disposed with a narrow pitch is decreased, a solder bridge is likely to be formed, frequently causing contact between adjacently disposed substrate pads through solder.

SUMMARY OF THE INVENTION

Accordingly, it is an object of the present invention to provide a structure for bonding a semiconductor device to a substrate, which structure makes it possible to prevent a solder bridge from being formed when substrate pads are arranged with small pitches.

It is another object of the present invention to provide a structure for bonding a semiconductor device to a substrate, which structure makes it possible to securely bond a semiconductor device to a substrate even if the amount of supplied solder varies.

It is still another object of the present invention to provide a structure for bonding a semiconductor device to a substrate, which structure makes it possible to prevent a joint from being broken due to thermal stress.

To achieve the above-described objects, according to the present invention, there is provided a structure for bonding a semiconductor to a substrate, which structure is equipped with: a first bump provided on a first electrode of a semiconductor device; a plurality of second electrodes which are arranged on a substrate at a predetermined pitch and each of which has a rectangular shape, the length of a first side in the direction of the array at the predetermined interval is smaller than the length of a second side; and a second bump provided on the second electrode, said second bump being melted to join with the first bump.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

The structure for bonding a semiconductor device to a substrate according to a first embodiment of the present invention will now be described in detail with reference to the accompanying drawings.

The structure for bonding a semiconductor device to a substrate according to this embodiment is provided with: an Al pad 2 formed on a semiconductor chip 1; a first bump 4 which is composed of a first metal such as Au and which is formed on the pad 2; a plurality of rectangular substrate pads 6 which are arranged on a circuit board 5 at predetermined pitches, and length L of a first side thereof in parallel to the arranging direction is smaller than length M of a second side thereof which is orthogonal to the first side, length L of the first side is smaller than the diameter of the first bump 4, and length M of the second side is larger than the diameter of the first bump 4; and a second bump 7 which is formed on the substrate pad 6, which melts to cover the first bump 4, and which is composed of a second metal such as eutectic Sn/Pb or other metal that is different from the first metal, the width thereof in the direction parallel to the first side being smaller than the diameter of the first bump 4 and the width thereof in the direction parallel to the second side being larger than the diameter of the first bump 4.

Figure 2:
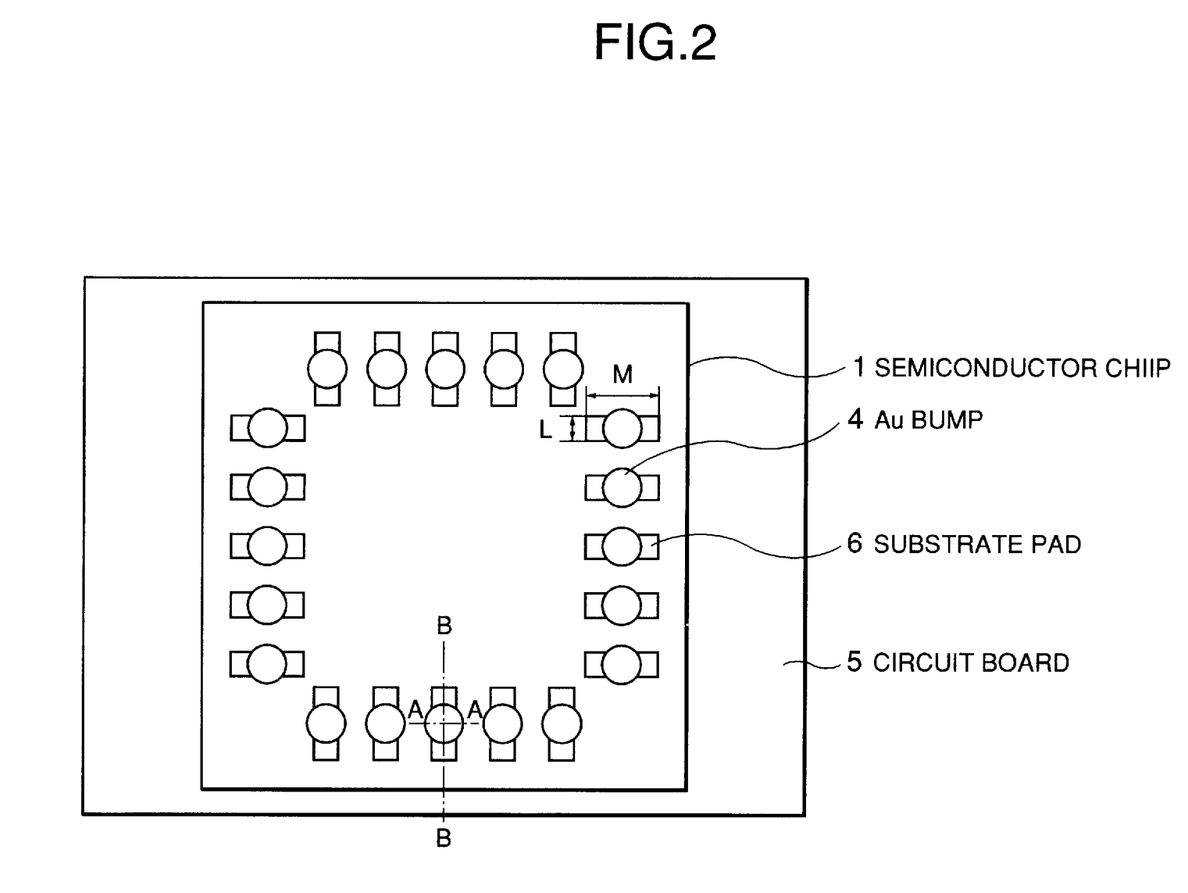
FIG. 2 is a top plan view illustrating a substrate connecting structure of the first through fourth embodiments of the present invention, and it is a top plan view showing a state before bonding.
Figure 3A:
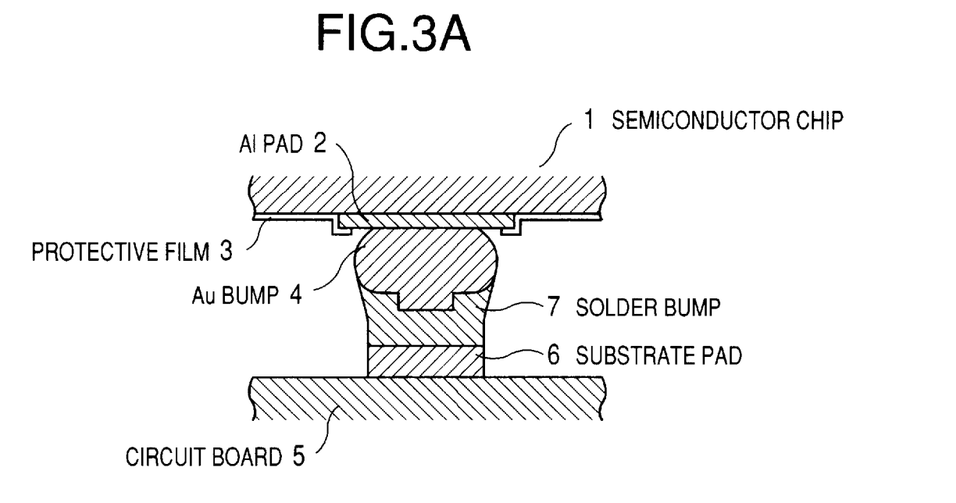
FIG. 3A is a cross-sectional view illustrating the substrate bonding structure of the first embodiment in accordance with the present invention, and more particularly, it is a cross-sectional view taken on lines A—A shown in FIG. 2.
Figure 3B:
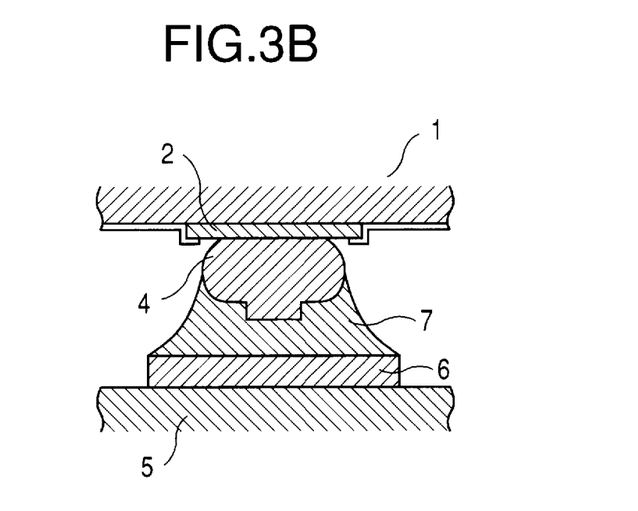
FIG. 3B is a cross-sectional view illustrating the substrate bonding structure of the first embodiment in accordance with the present invention, and more particularly, it is a cross-sectional view taken on lines B—B shown in FIG. 2.

Referring to FIG. 2 and FIGS. 3A and 3B, the Al pad 2 and a protective film 3 are formed on the semiconductor chip 1, and the Au bump 4 is formed on the Al pad 2. Formed on the substrate pad 6 of the circuit board 5 is the solder bump 7. When the semiconductor chip 1 and the circuit board 5 are bonded face down, the Au composing the Au bump 4 is diffused in the solder bump 7, thus forming an Au-Sn eutectic alloy.

A plurality of substrate pads 6 are arranged on the circuit board 5 at predetermined pitches. Length L of a side of the substrate pad 6 in the direction of the array (pitch) is smaller than the diameter of the Au bump 4 and length M of a side in the direction at right angles to the array direction is larger than the diameter of the Au bump 4. In other words, the substrate pad 6 is rectangular, the two orthogonal sides of which have different lengths.

The structure in which the semiconductor chip 1 and the circuit board 5 have been bonded is shown in FIG. 3A and FIG. 3B. The area around the joint between the Au bump 4 and the solder bump 7 is so shaped that the section taken on a plane (A—A) parallel to the short sides of the substrate pad 6 narrows slightly at the middle of the solder bump 7. This means that the width of the solder bump 7 is equal to or smaller than the diameter of the Au bump 4. In the section taken on a plane (B—B) parallel to the long sides of the substrate pad 6, the solder bump 7 has a gentle slope or fillet shape. In other words, the width of the solder bump 7 increases toward the substrate pad 6 and is larger than the diameter of the Au bump 4.

The joint configuration shown in FIG. 3A makes it possible to prevent a solder bridge from occurring in bonding when the substrate pads are arranged at small pitches or to prevent defective bonding due to unsoldering. More specifically, if excessive solder is supplied, the excess solder can be released in a direction orthogonal to the pitch direction on the substrate pad 6, that is, in the lengthwise direction. Conversely, if insufficient solder is supplied, solder can be sucked up from the direction to the pitch direction on the substrate pad 6, that is, from the lengthwise direction. Thus, inadequate solder wetting can be prevented.

The joint configuration shown in FIG. 3B provides a large bonding area between the solder and the substrate pad 6, so that the thermal stress is dispersed over the whole bonding area, making it possible to prevent the joint from being broken.

The ratio of the long and short sides of the substrate pad 6 should be in the range of 1.5 to 7.0. For example, the substrate pad 6 may be 60 $\mu$m wide by 250 $\mu$m long, or 40 $\mu$m wide by 250 $\mu$m long. A bump formed on the Al pad 2 may employ an alloy having Au as the primary ingredient thereof, or Cu, or an alloy having Cu as the primary ingredient thereof in place of Au. The solder for the solder bump 7 may be Sn/3.5 Ag or eutectic Sn/Pb.

The Au bump 4 may be formed using a general nail head bonding method.

Figure 4A:
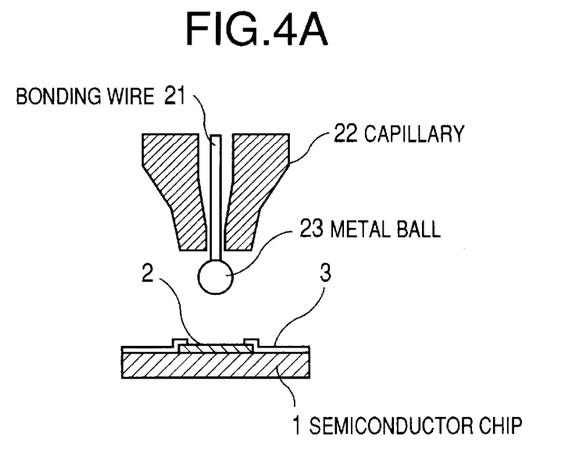
FIG. 4A through FIG. 4F are cross-sectional views illustrative of a method for forming an Au bump in the first embodiment in accordance with the present invention.
Figure 4B:
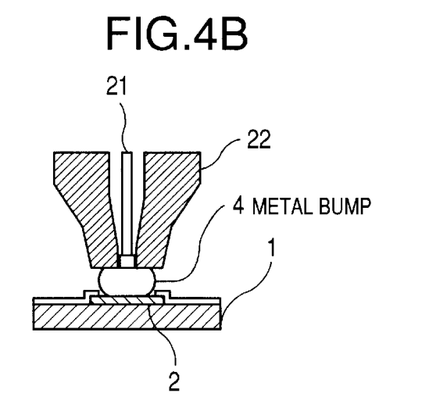
Figure 4C:
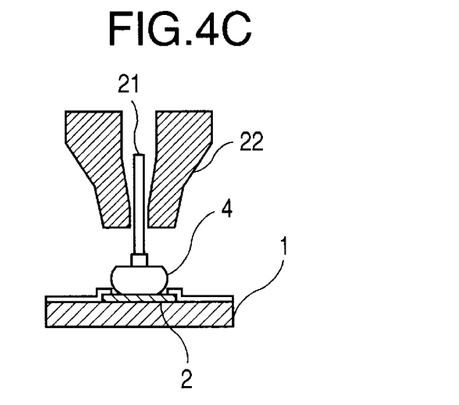

As shown in FIG. 4A through FIG. 4F, a bonding wire 21 is inserted in a capillary 22, and a metal ball 23 is formed on the distal end of the wire 21 (FIG. 4A). Then, the capillary 22 is positioned on the Al pad 2 of the semiconductor chip 1, which has been heated to 200 to 300 degrees Celsius by a heating state, not shown, and the metal ball 23 is bonded to the Al pad 2 by applying supersonic wave while pressing the metal ball 23 to deform it, thereby forming the Au bump 4 which is a metal projection (FIG. 4B).

Figure 4D:
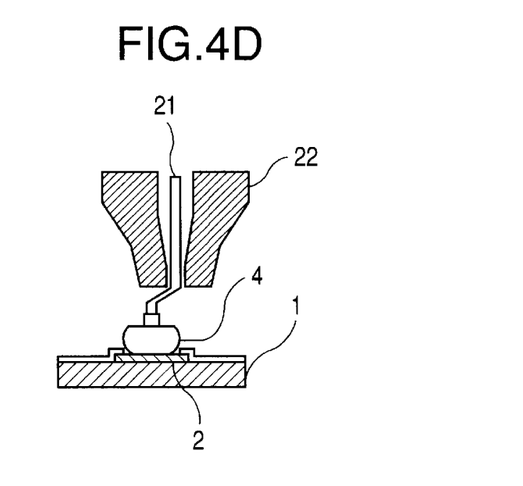
Figure 4E:
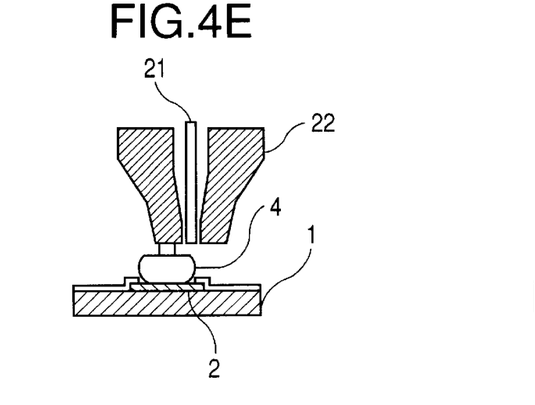
Figure 4F:
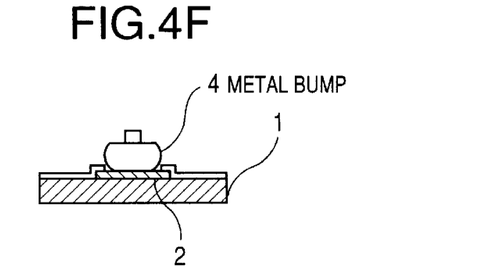

After that, the capillary 22 is raised (FIG. 4C) and moved sideways (FIG. 4D). Then, the capillary 22 is moved down to press the flat portion of the bottom surface of the capillary 22 against the wire portion of the bump 4 to deform the wire portion, then the wire is cut (FIG. 4E). Lastly, the capillary 22 is raised to complete the formation of the Au bump 4 (FIG. 4F).

This embodiment uses the nail head bonding method to form the Au bump, therefore, the bump can be immediately formed without forming a barrier metal layer on the Al pad 2 of the semiconductor chip 1. This method features a simpler manufacturing process and equipment than those in other bump forming methods such as plating or vacuum deposition, enabling the Au bump to be formed at lower cost.

Thus, according to the bonding structure of the embodiment, the substrate pads are shaped in rectangles wherein the sides thereof in the direction in which they are arranged at small pitches are made shorter and the other sides are made longer. Hence, bonding failures due to the occurrence of solder bridges or unsoldering can be prevented even if an improper amount of solder is supplied and the chances of breakage caused by thermal stress can also be minimized.

The bonding structure according to a second embodiment of the present invention will be described in conjunction with FIG. 5A and FIG. 5B.

Figure 5A:
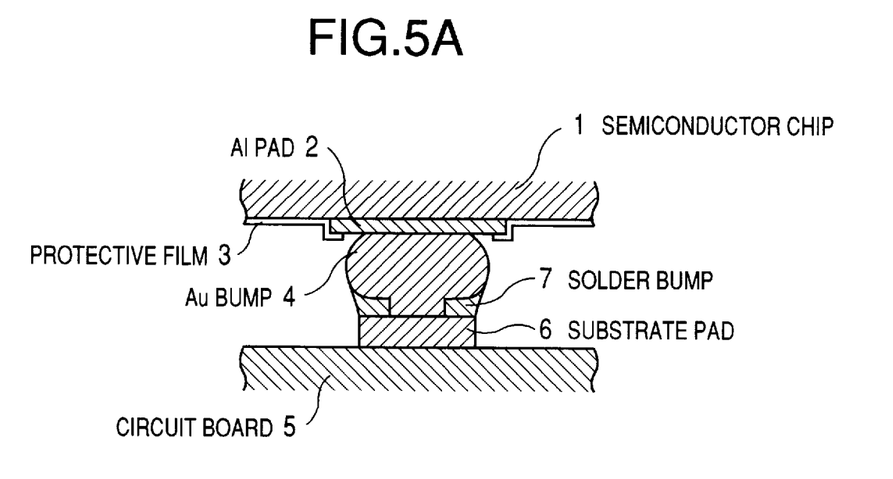
FIG. 5A is a cross-sectional view illustrating the substrate bonding structure of the second embodiment in accordance with the present invention, and more particularly, it is a cross-sectional view taken on lines A—A shown in FIG. 2.
Figure 5B:
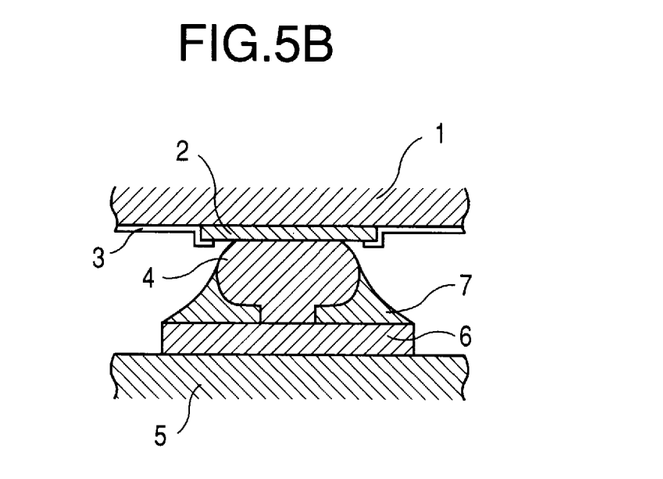
FIG. 5B is a cross-sectional view illustrating the substrate bonding structure of the second embodiment in accordance with the present invention, and more particularly, it is a cross-sectional view taken on lines B—B shown in FIG. 2.

In the bonding structure of this embodiment shown in FIG. 5A and 5B, the distal end of the Au bump is in direct contact with the substrate pad 6. This structure is obtained by applying higher pressure for bonding the semiconductor chip 1 and the circuit board 5.

Figure 6A:
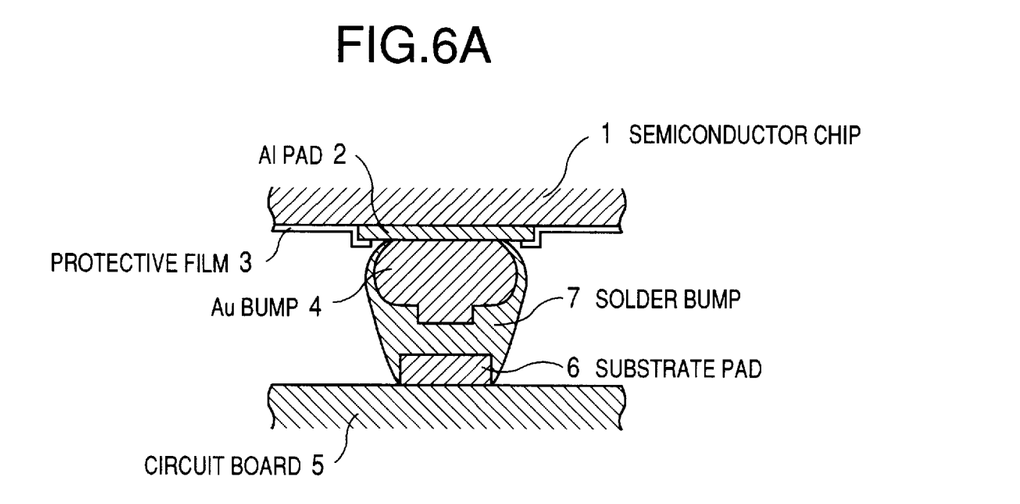
FIG. 6A is a cross-sectional view illustrating the substrate connecting structure of the third embodiment in accordance with the present invention, and more particularly, it is a cross-sectional view taken on lines A—A shown in FIG. 2.
Figure 6B:
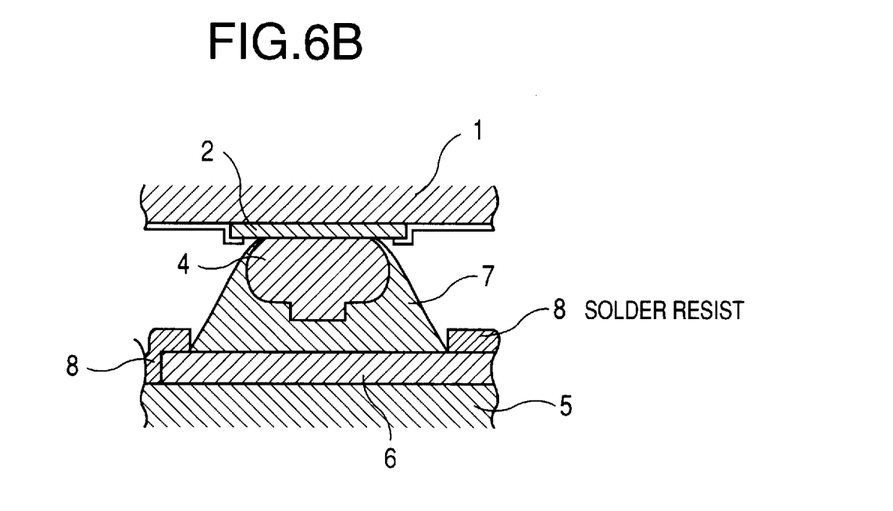
FIG. 6B is a cross-sectional view illustrating the substrate bonding structure of the third embodiment in accordance with the present invention, and more particularly, it is a cross-sectional view taken on lines B—B shown in FIG. 2.

The bonding structure according to a third embodiment of the present invention will now be described with reference to FIG. 6A and FIG. 6B.

In the bonding structure according to this embodiment, the solder bump 7 almost reaches the Al pad 2 and it thinly covers nearly the whole Au bump 4. The substrate pad 6 is covered with a solder resist 8 with a part of the wiring left uncovered as shown in FIG. 6B. The opening of the solder resist 8 is used as the substrate pad 6.

The structure of this embodiment can be obtained by increasing the volume of the solder bump 7 or by setting the temperature for bonding the semiconductor chip 1 and the circuit board 5 at a higher level.

The bonding structure according to the fourth embodiment of the present invention will now be described with reference to FIGS. 7A, 7B, and 7C.

Figure 7A:
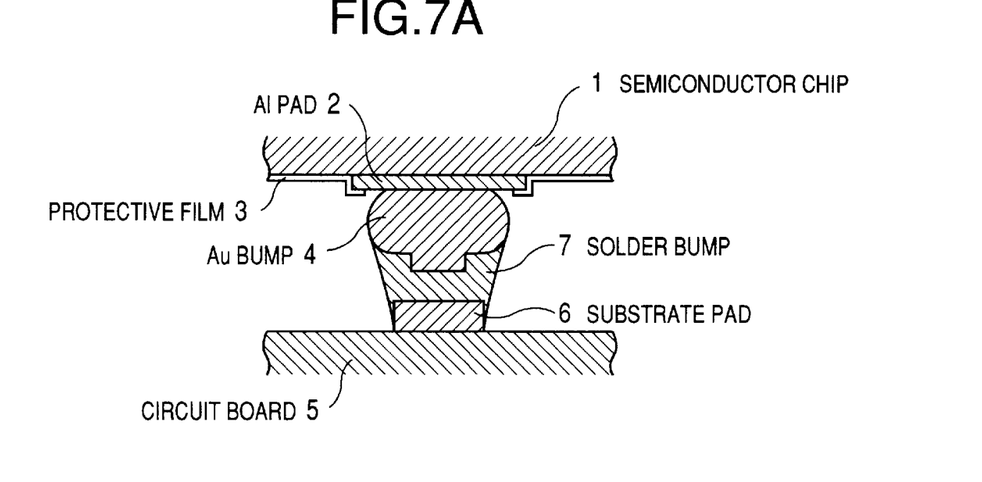
FIG. 7A is a cross-sectional view illustrating the substrate bonding structure of the fourth embodiment in accordance with the present invention, and more particularly, it is a cross-sectional view taken on lines A—A shown in FIG. 2.
Figure 7B:
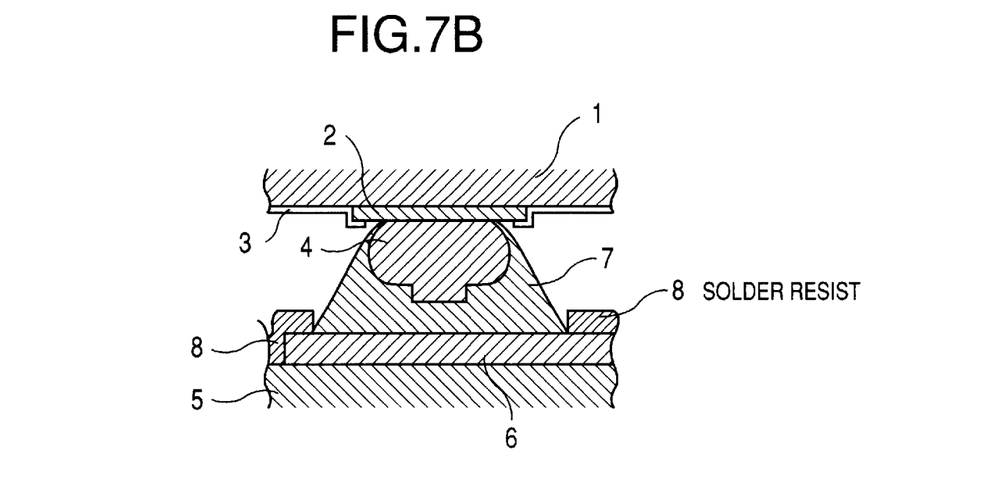
FIG. 7B is a cross-sectional view illustrating the substrate connecting structure of the fourth embodiment in accordance with the present invention, and more particularly, it is a cross-sectional view taken on lines B—B shown in FIG. 2.

Referring to FIG. 7A, the solder bump 7 almost reaches the middle of the Au bump 4 on the side surface which is to the pitch array direction of the substrate pad 6. In FIG. 7B, the solder bump 7 reaches the area near the Al pad 2 and thinly covers almost the whole surface of the Au bump 4 on the side surface in the pitch array direction of the substrate pad 6.

Figure 7C:
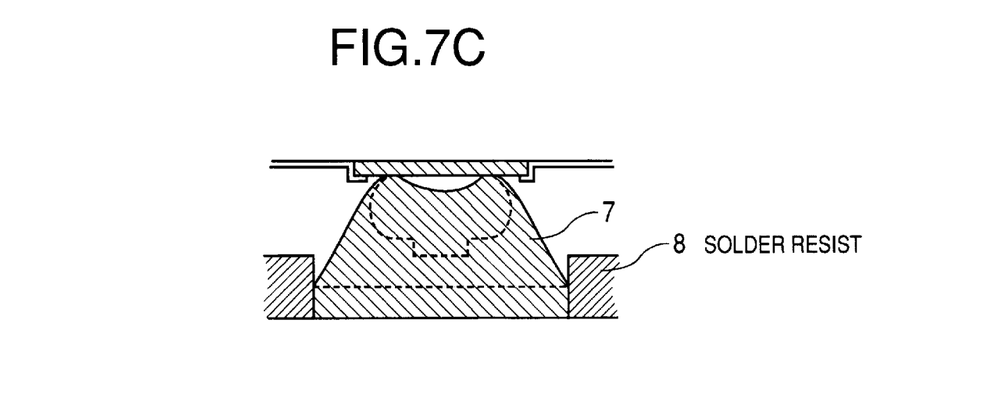
FIG. 7C is an external view observed from the same direction as that of FIG. 7B.

The joint configuration shown in FIG. 7C is obtained because the solder tends to gather from the lengthwise direction, i.e. from the shorter side, of the substrate pad 6.

The same advantages as those provided by the first embodiment can be achieved by the bonding structures according to any of the second embodiment to the fourth embodiment, the advantages being the prevention of bonding failures attributable to the occurrence of solder bridges or unsoldering and also the prevention of breakage of the joint caused by thermal stress.

What is claimed is:

1. A bonding structure for bonding a first substrate and a second substrate comprising:

a first bump formed by a first metal on a first electrode provided on the first substrate; and a second bump formed by a second metal on a second electrode provided on the second substrate, said second bump being bonded with said first bump;

wherein the width of said second bump is approximately equal to or smaller than the diameter of said first bump in a section in a first direction; and the width of said second bump is greater than the diameter of said first bump in the section in a second direction which is orthogonal to said first direction.

2. A bonding structure according to claim 1, wherein said first metal is different from said second metal.

3. A bonding structure according to claim 1, wherein said first metal is one of Au and an alloy having Au as the primary ingredient thereof.

4. A bonding structure according to claim 1, wherein said first metal is one of Cu and an alloy having Cu as the primary ingredient thereof.

5. A bonding structure according to claim 1, wherein said second metal is one of Sn/3.5 Ag and eutectic Sn/Pb.

6. A bonding structure according to claim 1, wherein said second bump has a sloped shape such that the width of said second bump increases toward said second electrode in the section in said second direction.

7. A bonding structure according to claim 1, wherein said second bump narrows at the middle of its height in the section in said first direction.

8. A bonding structure according to claim 1, wherein said second electrode is rectangular in which two orthogonal sides have different lengths.

9. A bonding structure according to claim 1, wherein the width of said second electrode is smaller than the diameter of said first bump in the section observed in said first direction and it is larger than the diameter of said first bump in the section observed in said second direction.

10. A structure for bonding a semiconductor device to a substrate comprising:

a first bump provided on a first electrode of a semiconductor device;

an arrangement of a plurality of second electrodes which are arranged on a substrate at a predetermined interval and each of which has a rectangular shape, the length of a first side in the direction of the arrangement at the predetermined interval is smaller than the length of a second side; and a second bump provided on the second electrode, said second bump being melted to join with the first bump.

11. A bonding structure according to claim 10, wherein the length of said first side of said second electrode is smaller than the diameter of said first bump and the length of said second side is greater than the diameter of said first bump.

12. A bonding structure according to claim 10, wherein said second electrode is rectangular, the length ratio of two orthogonal sides is 1 against 1.5 to 7.0.

13. A bonding structure according to claim 10, wherein the first bump has a distal end which is in direct contact with said second electrode.

14. A bonding structure according to claim 10, wherein said second bump which has been melted covers approximately the whole first bump.

15. A bonding structure according to claim 10, wherein said second bump which has been melted covers approximately the whole first bump on a side surface of a first side of said second electrode and covers said first bump up to an area proximate the middle of said first bump on the side surface of said second side.

16. A structure for bonding a semiconductor device to a substrate comprising:

an electrode formed on a semiconductor device;

a first bump including a first metal formed on said electrode;

a plurality of substrate pads which are arranged on a substrate at predetermined pitches and the length of a first side thereof in parallel to an array direction is smaller than the length of a second side thereof which is orthogonal to the first side, the length of said first side is equal to or smaller than the diameter of the first bump, and the length of said second side is larger than the diameter of said first bump; and a second bump including a second metal which is different from said first metal, said second bump being formed on said substrate pad and melted to cover said first bump, the width thereof in the direction parallel to said first side being smaller than the diameter of said first bump and the width thereof in the direction parallel to said second side being larger than the diameter of said first bump.

17. A bonding structure according to claim 16, wherein said second bump covers approximately the whole surface of said first bump from said first side and it covers said first bump up approximately to the area around the middle thereof from said second side.

18. A bonding structure according to claim 16, wherein said first bump is formed by nail head bonding.

19. A bonding structure according to claim 17, wherein the first bump has a distal end which is flat and said distal end is in direct contact with said second electrode.

* * * * *